(12) United States Patent
Yamamoto et al.

(10) Patent No.: US 8,154,074 B2
(45) Date of Patent: Apr. 10, 2012

(54) SILICON CARBIDE SEMICONDUCTOR DEVICE AND MANUFACTURING METHOD OF THE SAME

(75) Inventors: Kensaku Yamamoto, Chiryu (JP); Takeshi Endo, Obu (JP); Eiichi Okuno, Mizuho (JP)

(73) Assignee: DENSO CORPORATION, Kariya (JP)

( * ) Notice: Subject to any disclaimer, the term of this patent is extended or adjusted under 35 U.S.C. 154(b) by 231 days.

(21) Appl. No.: 12/458,271

(22) Filed: Jul. 7, 2009

(65) Prior Publication Data
US 2010/0006861 A1   Jan. 14, 2010

(30) Foreign Application Priority Data

Jul. 8, 2008   (JP) ................. 2008-177598

(51) Int. Cl.
 *H01L 29/76* (2006.01)
 *H01L 31/062* (2012.01)
(52) U.S. Cl. .......... 257/330; 257/329; 257/77; 257/341; 257/342; 438/270
(58) Field of Classification Search .......... 257/329–330, 257/341–342, 77, E29.262, E21.066, E21.41; 438/270
See application file for complete search history.

(56) References Cited

U.S. PATENT DOCUMENTS

| 6,445,037 | B1 * | 9/2002 | Hshieh et al. ................. 257/330 |
| 2003/0075759 | A1 | 4/2003 | Kawano et al. |
| 2004/0159885 | A1 | 8/2004 | Kawano et al. |
| 2007/0057262 | A1 | 3/2007 | Nakamura et al. |
| 2009/0072241 | A1 * | 3/2009 | Harris et al. .................... 257/77 |

FOREIGN PATENT DOCUMENTS
JP   A-2006-228901   8/2006

OTHER PUBLICATIONS

Notice of Reasons for Refusal dated Jul. 27, 2010 in corresponding Japanese application No. 2008-177598 (English translation enclosed).

* cited by examiner

*Primary Examiner* — Theresa T Doan
(74) *Attorney, Agent, or Firm* — Posz Law Group, PLC

(57) ABSTRACT

A SiC semiconductor device includes: a substrate; a drift layer on a first side of the substrate; a trench in the drift layer; a base region contacting a sidewall of the trench; a source region in an upper portion of the base region; a gate electrode in the trench via a gate insulation film; a source electrode on the source region; and a drain electrode on a second side of the substrate. The source region has multi-layered structure including a first layer and a second layer. The first layer as an upper layer contacts the source electrode with ohmic contact. The second layer as a lower layer has an impurity concentration, which is lower than an impurity concentration of the first layer.

9 Claims, 4 Drawing Sheets

SILICON CARBIDE SEMICONDUCTOR DEVICE AND MANUFACTURING METHOD OF THE SAME

CROSS REFERENCE TO RELATED APPLICATION

This application is based on Japanese Patent Application No. 2008-177598 filed on Jul. 8, 2008, the disclosure of which is incorporated herein by reference.

FIELD OF THE INVENTION

The present invention relates to a silicon carbide semiconductor device having a vertical type trench gate semiconductor element and a manufacturing method of the same.

BACKGROUND OF THE INVENTION

Silicon carbide (i.e., SiC) is attracting attention as material of a power device since the silicon carbide has high electric breakdown strength. Since the SiC has high breakdown strength, the power device formed from SiC can control large current. Accordingly, application of SiC for a hybrid vehicle is expected.

To flow large current in a power device, it is effective to increase a channel density. In a silicon transistor, a vertical type trench gate power MOSFET is used for the power device. This structure is also applied to a SiC transistor.

When the SiC is used for the power device, a face orientation of a sidewall of a trench for defining a channel region is set to be a certain face orientation, which provides high channel mobility since the channel mobility largely depends on the face orientation. This is disclosed in JP-A-2007-80971 corresponding to US 2007/0057262.

In the vertical type trench gate power MOSFET, a P type base region for providing a channel region is formed, and a N+ type source region is formed on the base region. The impurity concentration of the source region is high so that the source region contacts a source electrode with ohmic contact. A trench is formed to penetrate the source region and the base region. The trench provides a trench gate structure. A corner of the trench is rounded so that an electric field concentration is reduced. Specifically, the trench is etched by hydrogen so as to round the corner of the trench.

However, when the corner of the trench is rounded, the source region is side-etched. When a side-etching amount of the source region is large, not only the source region but also the base region is side-etched, so that the base region is also rounded. Thus, the sidewall of the trench for defining the channel region may include a part having a face orientation different from the certain face orientation. In this case, since the part of the sidewall has the face orientation, which does not provide high channel mobility, the required channel mobility is not obtained. The inventors have preliminary studied about a relationship between the channel mobility and side-etching effect. FIG. 5 shows the relationship of the channel mobility. When the side-etching of the base region is not performed so that the trench does not include the part having the face orientation different from the certain face orientation, a whole of the channel region is provided by the certain face orientation. When the side-etching of the base region is performed so that the trench includes the part having the face orientation different from the certain face orientation, a part of the channel region is not provided by the certain face orientation. The channel mobility in a case where the side-etching of the base region is not performed is larger than that in a case where the side-etching of the base region is performed. Thus, the channel mobility is largely reduced.

To improve the reduction of the channel mobility, the sidewall of the trench is controlled to have the certain face orientation precisely. Thus, a process window for the hydrogen etching process and source region forming process becomes narrow. Thus, it is difficult to modify in-pane variation, which is generated necessarily in a forming process.

SUMMARY OF THE INVENTION

In view of the above-described problem, it is an object of the present disclosure to provide a silicon carbide semiconductor device. It is another object of the present disclosure to provide a manufacturing method of a silicon carbide semiconductor device.

According to a first aspect of the present disclosure, a SiC semiconductor device includes: a substrate made of SiC and having a first conductive type or a second conductive type; a drift layer made of SiC, having the first conductive type, and disposed on a first side of the substrate; a trench perpendicular to a surface of the drift layer and disposed in the drift layer; a base region having the second conductive type, made of SiC, contacting a sidewall of the trench, and sandwiching the trench; a source region made of SiC, having the first conductive type, contacting the sidewall of the trench, sandwiching the trench, and arranged in an upper portion of the base region; a gate insulation film disposed on an inner wall of the trench; a gate electrode disposed in the trench via the gate insulation film; a source electrode electrically coupled with the source region and the base region; and a drain electrode disposed on a second side of the substrate. The second side is opposite to the first side. A part of the base region contacting the sidewall of the trench provides a channel region so that current flows between the source electrode and the drain electrode via the source region, the channel region and the drift layer when a voltage is applied to the gate electrode. The source region has multi-layered structure including a first layer and a second layer. The first layer as an upper layer contacts the source electrode with ohmic contact. The second layer as a lower layer has an impurity concentration, which is lower than an impurity concentration of the first layer.

In the above device, even when a corner of the trench is rounded, the sidewall of the trench corresponding to the channel region in the base region has a certain face orientation, so that channel mobility is improved.

According to a second aspect of the present disclosure, a manufacturing method of a SiC semiconductor device includes: forming a drift layer on a front side of a substrate, wherein the substrate is made of SiC and has a first conductive type or a second conductive type, and the drift layer is made of SiC and has the first conductive type; implanting an impurity having the second conductive type at a predetermined position on a surface of the drift layer, or growing a second conductive type layer at the predetermined position on the surface of the drift layer so that a base region having the second conductive type and made of SiC is formed; implanting an impurity having the first conductive type in a surface portion of the base region so that a source region having the first conductive type and made of SiC is formed; etching the source region, the base region and the drift layer perpendicular to the surface of the drift layer so that a trench penetrating the source region and the base region and reaching the drift layer is formed; rounding a corner of the trench; forming a gate insulation film on an inner wall of the trench after the rounding; forming a gate electrode in the trench via the gate insulation film; forming a source electrode electrically coupled with the source region; and forming a drain electrode on a backside of the substrate. The implanting the impurity having the first conductive type includes: forming a first layer as an upper layer; and forming a second layer as a lower layer. The second layer has an impurity concentration, which is lower than an impurity concentration of the first layer.

In the above method, even when a corner of the trench is rounded, the sidewall of the trench corresponding to the channel region in the base region has a certain face orientation, so that channel mobility is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
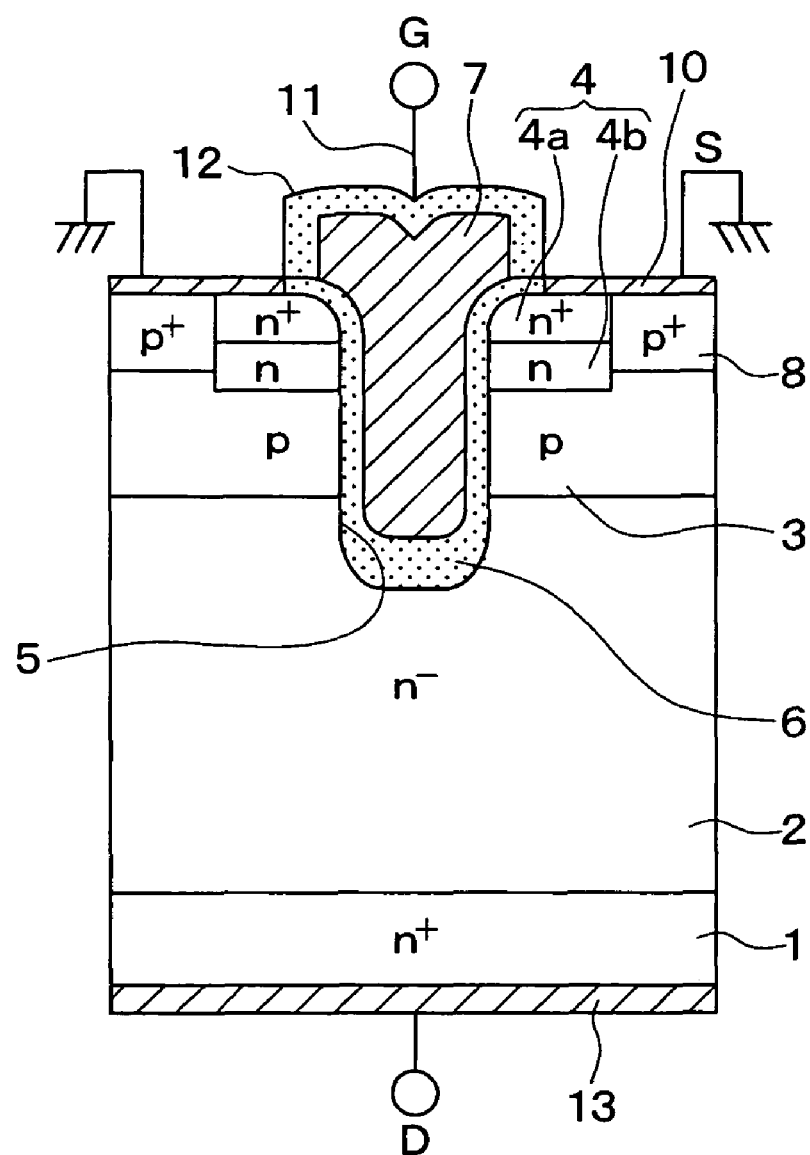
FIG. 1 is a cross sectional view showing a trench gate MOSFET according to a first embodiment.

A SiC semiconductor device according to a first embodiment includes an inverse trench gate MOSFET, which is shown in FIG. 1. The SiC semiconductor device includes multiple MOSFETS in FIG. 1, which are aligned with a predetermined direction.

The MOSFET includes a N+ type substrate 1 as a semiconductor substrate. The substrate 1 has a front surface with a {0001}-face orientation (i.e., a c-face orientation). The substrate 1 includes nitrogen as a N type impurity, and has an impurity concentration of $1.0 \times 10^{19}/cm^3$. The thickness of the substrate 1 is 300 microns. A N− type drift layer 2 made of SiC is formed on the substrate 1. The drift layer 2 includes nitrogen as the N type impurity, and has an impurity concentration of $8.0 \times 10^{15}/cm^3$, which is lower than the substrate 1. The thickness of the substrate 1 is about 15 microns. A P+ type base region 3 is formed in a surface portion of the drift layer 2. A N type source region 4 is formed in an upper portion of the base region 3.

The base region 3 includes a P type impurity such as boron and aluminum. The impurity concentration of the base region 3 is, for example, $1.0 \times 10^{19}/cm^3$, and the thickness of the base region 3 is about 0.7 microns. The source region 4 has a two-layered structure so that the source region 4 includes a lower layer and an upper layer. Thus, the source region 4 includes the upper layer as a first layer 4a and the lower layer as a second layer 4b. The impurity concentration of the first layer 4a is different from the impurity concentration of the second layer 4b. Both of the first and second layers 4a, 4b has the N type impurity. For example, the N type impurity concentration of the first layer 4a is higher than that of the second layer 4b. The impurity concentration of the first layer 4a is in a range between $1 \times 10^{20}/cm^3$ and $1 \times 10^{22}/cm^3$, so that the impurity concentration of the first layer 4a is equal to or smaller than a solid solubility limit. The N type impurity concentration of the second layer 4b is higher than the P type impurity concentration of the base region 3. For example, the impurity concentration of the base region 3 is equal to or smaller than $1 \times 10^{20}/cm^3$.

The N type impurity doped in the first layer 4a may be the same as the N type impurity doped in the second layer 4b. In the present embodiment, the N type impurity doped in the first layer 4a is different from the N type impurity doped in the second layer 4b. Specifically, an atomic radius of the impurity in the second layer 4b is smaller than that in the first layer 4a. The impurity in the first layer 4a is phosphorus, and the impurity in the second layer 4b is nitrogen. The thickness of the source region 4 is equal to or larger than 0.1 microns. The thickness of the source region 4 is defined from the surface of the first layer 4a to the bottom of the second layer 4b.

A trench 5 is formed to penetrate the base region 3 and the source region 4 and to reach the drift layer 2. The width of the trench 5 is, for example, 2.0 microns, and the depth of the trench 5 is 2.0 microns. The base, region 3 and the source region 4 contact the sidewall of the trench 5. An open end of the trench 5, which is an opening side of the trench 5, is over-etched by a side-etching effect, so that the open end is rounded. The rounded open end of the trench 5 is disposed in the source region 4 so that an edge of the rounded open end is arranged within the first layer 4a. Thus, the sidewall of the trench 5 in the base region 3 is perpendicular to the substrate 1. Specifically, the trench 5 has a bottom with a {0001}-face orientation (i.e., a c-face orientation), which is the same as the surface of the substrate 1. The sidewall of the trench 5 has a face orientation such as a {11-20}-face orientation (i.e., a a-face orientation), which is defined by a <11-20>-direction.

The inner wall of the trench 5 is covered with a gate oxide film 6. A gate electrode 7 is formed on the surface of the gate oxide film 6. The gate electrode 7 is made of doped poly silicon. The gate electrode 7 with the gate oxide film 6 fills the trench 5. The gate oxide film 6 is formed by thermally oxidizing the inner surface of the trench 5. The oxidizing rate of the bottom of the trench 5 is five times larger than that of the sidewall of the trench 5. The thickness of the gate oxide film 6 on the sidewall of the trench 5 is about 40 nanometers, and the thickness of the gate oxide film 6 on the bottom of the trench 5 is about 200 nanometers.

A P+ type contact region 8 is formed in a center surface portion of the base region 3 disposed between two adjacent trenches 5 so that the contact region 8 is sandwiched between the source regions 4. The contact region 8 is opposite to the trench 5. The contact region 8 has boron or aluminum impurity concentration in a range between $1.0 \times 10^{17}/cm^3$ and $1.0 \times 10^{20}/cm^3$.

A source electrode 10 and a gate wiring 11 are formed on the surface of the source region 4, the surface of the contact region 8 and the surface of the gate electrode 7. The source electrode 10 and the gate wiring 11 are made of multiple metals such as nickel and aluminum. At least a part of the source electrode 10 and at least a part of the gate wiring 11 are made of metal, which is capable of contacting N type SiC with ohmic contact. The part of the source electrode 10 and the part of the gate wiring 11 contact N type SiC. Specifically, the part of the source electrode 10 and the part of the gate wiring 11 contact the gate electrode 7 when the source region 4 and the gate electrode 7 are made of N type impurity doped material. At least another part of the source electrode 10 and at least another part of the gate wiring 11 are made of metal, which is capable of contacting P type SiC with ohmic contact. The other part of the source electrode 10 and the other part of the gate wiring 11 contact P type SiC. Specifically, the other part of the source electrode 10 and the other part of the gate wiring 11 contact the gate electrode 7 when the contact region 8 and the gate electrode 7 are made of P type impurity doped material. The source electrode 10 and the gate wiring 11 are formed on an interlayer insulation film 12 so that the source electrode 10 and the gate wiring 11 are electrically isolated, respectively. The source electrode 10 is electrically coupled with the source region 4 and the contact region 8 via a contact hole, which is formed in the interlayer insulation film 12. The gate wiring 11 is electrically coupled with the gate electrode 7 via another contact hole, which is formed in the interlayer insulation film 12.

A drain electrode 13 is formed on a backside of the substrate 1. The drain electrode 13 is electrically coupled with the substrate 1. Thus, the N channel inverse type trench gate MOSFET is completed.

When a gate voltage is applied to the gate electrode 7, a part of the base region 3 contacting the gate oxide film 6 on the sidewall of the trench 5 provides an inverse type channel so that current flows between the source electrode 10 and the drain electrode 13.

A part of the sidewall of the trench 5 corresponding to the base region 3 provides the channel region. The part of the sidewall is perpendicular to the surface of the substrate 1, and has a certain face orientation. Accordingly, the desired channel mobility is obtained.

A manufacturing method of the trench gate MOSFET will be explained as follows with reference to FIGS. 2A to 3B.

Figure 2A:
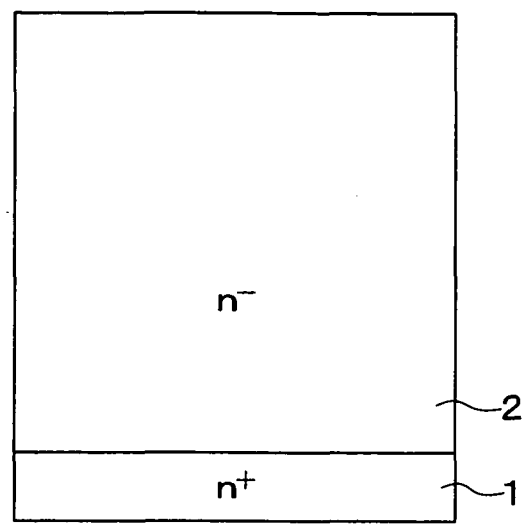
FIGS. 2A to 2C are cross sectional views showing a manufacturing method of the MOSFET in FIG. 1.

(Step in FIG. 2A)

First, the N+ type substrate 1 is prepared such that the thickness of the substrate 1 is about 300 μm, the surface of the substrate 1 has the {0001}-face orientation, and the nitrogen impurity concentration of the substrate 1 is $1.0 \times 10^{19}/cm^3$. The N− type drift layer 2 is epitaxially grown on the surface of the substrate 1. The drift layer 2 has the nitrogen impurity concentration of, for example, $8.0 \times 10^{15}/cm^3$, and the thickness of the drift layer 2 is about 15 μm.

Figure 2B:
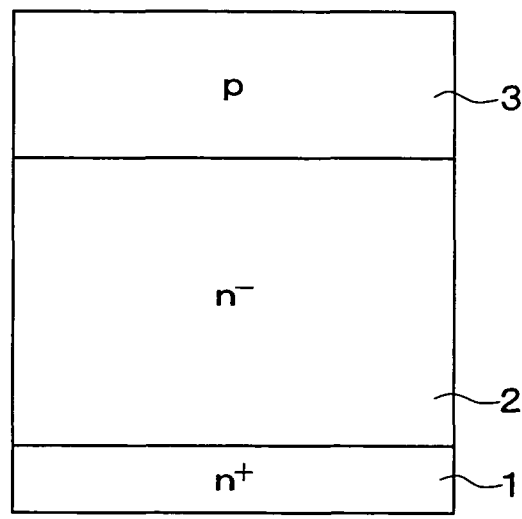

(Step in FIG. 2B)

A mask (not shown) made of a LTO (i.e., low temperature oxide) film is formed on the surface of the drift layer 2. Then, an opening corresponding to a base-region-to-be-formed region is formed in the mask with a photo lithography process. A P type impurity ion such as boron ion or aluminum ion is implanted through the mask, and the impurity ion is activated. Thus, the P type base region 3 is formed such that the thickness of the base region 3 is about 0.7 μm, and the boron impurity concentration or the aluminum impurity concentration is $1.0 \times 10^{19}/cm^3$. Then, the mask is removed. Although the base region 3 is formed by an ion implantation method, the base region 3 may be formed on the surface of the drift layer 2 by an epitaxial growth method.

Figure 2C:
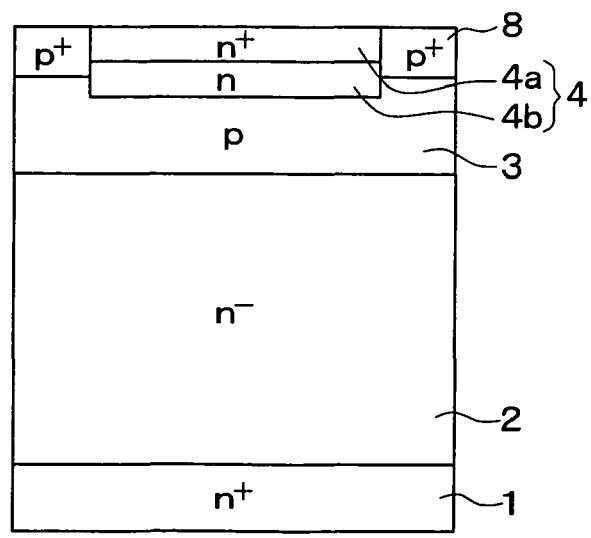

(Step in FIG. 2C)

A mask (not shown) made of, for example, a LTO film is formed on the drift layer 2 and the base region 3. An opening corresponding to a source-region-to-be-formed region is formed in the mask in a photo lithography process. Then, the N type impurity ion is implanted through the mask, and then, the ion is activated. Thus, the first layer 4a and the second layer 4b are formed. In this case, the mask for the first layer 4a is the same as the mask for the second layer 4b, so that a manufacturing step is simplified.

In the above step, two ions such as phosphorous and nitrogen are selected for the N type impurities having different atomic radius. By controlling ion implantation energy, the phosphorous is introduced into the first-layer-to-be-formed region, and the nitrogen is introduced into the second-layer-to-be-formed region. Here, the phosphorous ion implantation step may be performed after or before the nitrogen ion implantation step. Then, the ions are activated. Thus, the first layer 4a having the N type impurity concentration in a range between $3 \times 10^{20}/cm^3$ and $1 \times 10^{22}/cm^3$ is formed. The second layer 4b having the N type impurity concentration equal to or smaller than $1 \times 10^{20}/cm^3$ is formed. Then, the mask is removed.

A mask (not shown) is formed on the drift layer 2, the base region 3 and the source region 4. An opening corresponding to a contact-region-to-be-formed region is formed in the mask. Then, the P type impurity is implanted through the mask, and then, the impurity is activated. Thus, the P+ type contact region 8 having the P type impurity concentration in a range between $1.0 \times 10^{17}/cm^3$ and $1.0 \times 10^{20}/cm^3$ is formed. Then, the mask is removed.

After the source region 4 is formed, the contact region 8 is formed. Alternatively, the contact region 8 may be formed before the source region 4 is formed. Although the ion activation process for each of the source region 4 and the contact region 8 is independently performed, the ion activation process for the source region 4 may be performed at the same time as the ion activation process for the contact region 8.

Figure 3A:
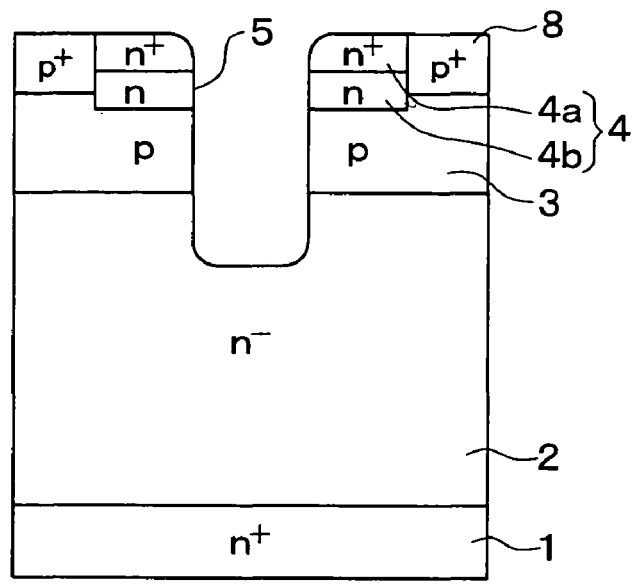
FIGS. 3A and 3B are cross sectional views showing the manufacturing method of the MOSFET in FIG. 1.

(Step in FIG. 3A)

An etching mask (not shown) is formed on the drift layer 2, the base region 3 and the source region 4. An opening corresponding to a trench-to-be-formed region is formed in the mask. An anisotropic etching is performed with using the etching mask, so that the trench 5 is formed. Then, after the etching mask is removed, a rounding process for rounding a corner of the trench 5 is performed. The rounding process is performed with using hydrogen. If necessary, sacrifice oxide process may be performed.

The source region 4 at the corner of the trench 5 is also rounded by the side-etching effect in the rounding process. The source region 4 has a two-layered structure having the first and second layers 4a, 4b having different N type impurity concentrations. Accordingly, the first layer 4a having the high impurity concentration is easily over-etched, and the second layer 4b having the low impurity concentration is hardly over-etched. Specifically, the atomic radius of the ion implanted in the second layer 4b is smaller than that in the first layer 4a. For example, the phosphorus is implanted in the first layer 4a, and the nitrogen is implanted in the second layer 4b. Thus, the second layer 4b has crystal defects in the ion implantation process, which is smaller than crystal defects in the first layer 4a. Thus, the second layer 4b is hardly side-etched in the rounding process.

The thickness of the source region 4 is equal to or larger than 0.1 μm. Accordingly, even if the second layer 4b is slightly side-etched in the rounding process, the side-etching does not affect the base region 3. Accordingly, the rounding portion of the trench 5 is disposed within the source region 4. Specifically, the rounding portion of the trench 5 is arranged in the first layer 4a.

Thus, the sidewall of the trench 5 corresponding to the base region 3 is perpendicular to the substrate 1. Specifically, the sidewall of the trench 5 corresponding to the base region 3 has a face orientation defined by the <11-20>-direction. The face orientation of the sidewall of the trench 5 is, for example, a {11-20}-face orientation.

Figure 3B:
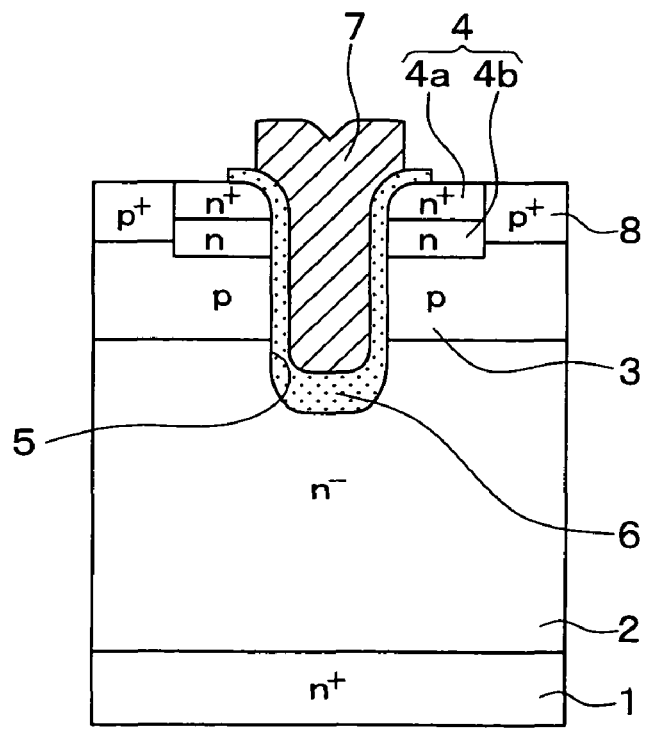

(Step in FIG. 3B)

A step for forming a gate oxide film is performed, and the gate oxide film 6 is formed. Specifically, the gate oxide film 6 is formed by a pyrogenic method under wet atmosphere. The pyrogenic method provides a gate oxidation, i.e., thermal oxidation. The above gate oxidation provides that the oxidation rate of the bottom of the trench 5 is five times larger than that of the sidewall of the trench 5 since the bottom of the trench 5 has the {0001}-face orientation, which is the same as the substrate 1, and the sidewall of the trench 5 is defined by the <11-20>-direction. Accordingly, for example, the thickness of the gate oxide film 6 on the sidewall of the trench 5 is about 40 nm, and the thickness of the gate oxide film 6 on the bottom of the trench 5 is about 200 nm.

Then, a poly silicon layer is deposited on the surface of the gate oxide film 6 at 600° C. A N type impurity is doped in the poly silicon layer. The thickness of the poly silicon layer is 440 nm. Then, a resist as a mask, which is patterned by a photo lithography etching method, is formed on the poly silicon layer and the gate oxide film 6. Then, the poly silicon layer and the gate oxide film 6 are patterned with using the mask. Thus, the gate oxide film 6 and the gate electrode 7 are arranged in the trench 5.

Then, the interlayer insulation film 12 is deposited, and then, the interlayer insulation film 12 is patterned so that the contact holes for connecting to the source region 4 and the contact region 8 are formed. Further, another contact hole for connecting to the gate electrode 7 is formed at a different position. Then, electrode material is embedded in the contact holes, and the electrode material is patterned so that the source electrode 10 and the gate electrode 11 are formed. The drain electrode 13 is formed on the backside of the substrate 1. Thus, the MOSFET in FIG. 1 is completed.

In the SiC semiconductor device, the source region 4 has multi-layered structure. Thus, an upper portion of the source region 4 has high impurity concentration so that the upper portion contacts the source electrode 10 with ohmic contact. Further, the base region 3 is not over-etched when the corner of the trench 5 is rounded. Thus, in the SiC semiconductor device having the vertical type trench gate semiconductor element, the sidewall of the trench corresponding to the base region for defining the channel region has a certain face orientation. Thus, even when the corner of the trench 5 is rounded, the channel mobility is not reduced.

Second Embodiment

A trench gate MOSFET according to a second embodiment has a different source region 4.

Figure 4:
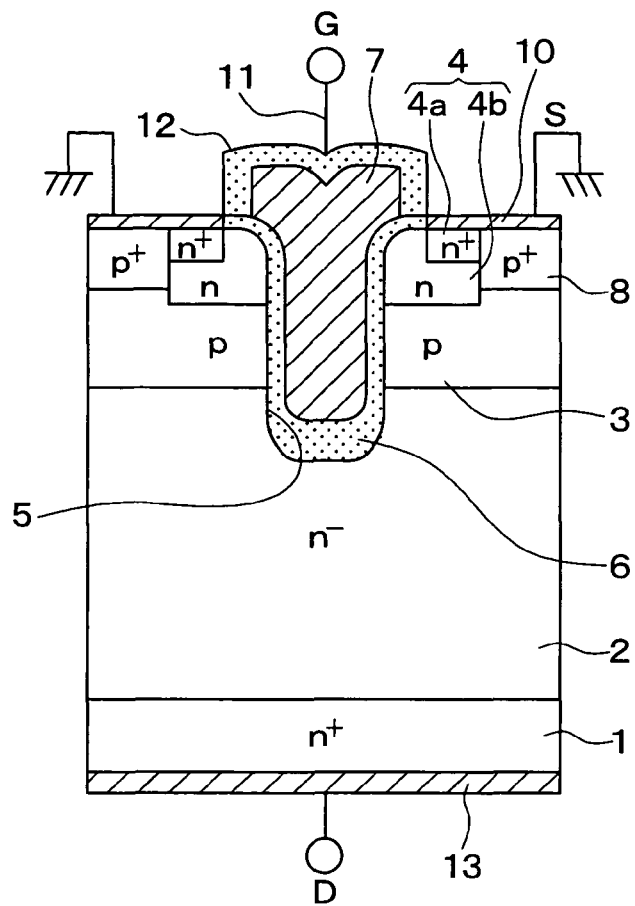
FIG. 4 is a cross sectional view showing a trench gate MOSFET according to a second embodiment.
Figure 5:
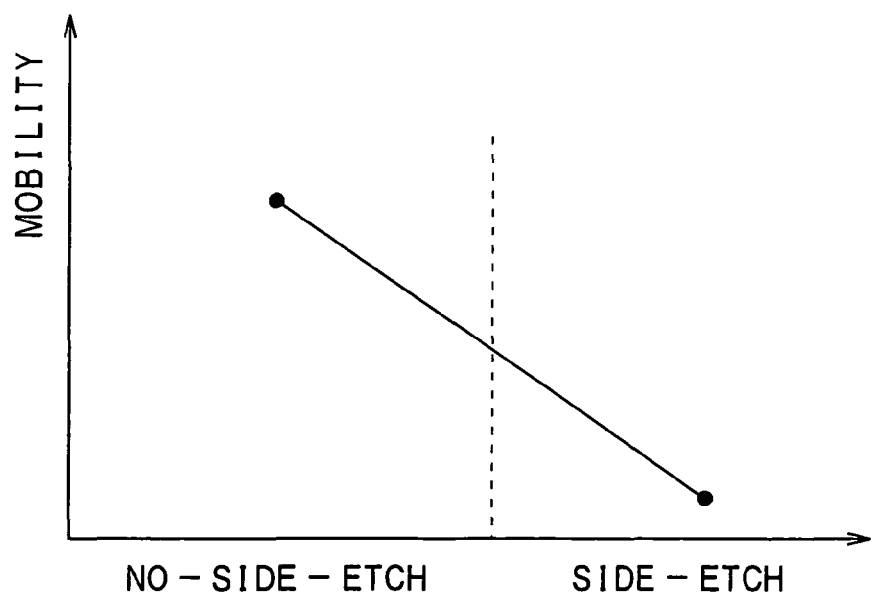
FIG. 5 is a graph showing channel mobility in a case of no side-etch and in a case of side-etch according to a related art.

FIG. 4 shows the MOSFET according to the second embodiment. The N type source region 4 includes the first and second layers 4a, 4b. The first layer 4a is not arranged around the corner of the trench 5 so that the first layer 4a is separated from the sidewall of the trench 5. The first layer 4a is arranged only under the source electrode 10 so that the first layer 4a contacts the source electrode 10. Specifically, the first layer 4a is arranged at a region, which contacts only the source electrode 10, the second layer 4b and the P+ type contact region 8. In this case, since the first layer 4a is not arranged around the corner of the trench 5, the over-etching amount of the corner of the trench 5 becomes small when the corner is rounded. Accordingly, the base region 3 is not side-etched substantially. Thus, even when the corner of the trench 5 is rounded, the channel mobility is not reduced.

In the present embodiment, a mask for forming the first layer 4a is different from another mask for forming the second layer 4b since layout of the first layer 4a is different from layout of the second layer 4b.

Other Embodiments

In the above embodiments, the N type provides a first conductive type, and the P type provides a second conductive type, so that the N channel MOSFET is provided. Alternatively, the P type may provide a first conductive type, and the N type may provide a second conductive type, so that the P channel MOSFET is provided. Although the SiC semiconductor device includes the trench gate MOSFET, the SiC semiconductor device may include a trench gate IGBT. In this case, the substrate 1 has the P conductive type in FIGS. 1 and 4.

The sidewall of the trench 5 is defined by the <11-20>-direction. Alternatively, the sidewall of the trench 5 may be defined by a <1-100>-direction, and the bottom of the trench 5 may have a {0001}-silicon face orientation. The gate insulation film is made of the gate oxide film 6 in the trench 5. Alternatively, the gate insulation film in the trench 5 may be made of an ONO film.

The MOSFET may include a P+ type deep layer. For example, the deep layer may be formed under the contact region 8. The deep layer is deeper than the base region 3. The deep layer may be perpendicular to or crossed with a longitudinal direction of the trench 5.

The above disclosure has the following aspects.

According to a first aspect of the present disclosure, a SiC semiconductor device includes: a substrate made of SiC and having a first conductive type or a second conductive type; a drift layer made of SiC, having the first conductive type, and disposed on a first side of the substrate; a trench perpendicular to a surface of the drift layer and disposed in the drift layer; a base region having the second conductive type, made of SiC, contacting a sidewall of the trench, and sandwiching the trench; a source region made of SiC, having the first conductive type, contacting the sidewall of the trench, sandwiching the trench, and arranged in an upper portion of the base region; a gate insulation film disposed on an inner wall of the trench; a gate electrode disposed in the trench via the gate insulation film; a source electrode electrically coupled with the source region and the base region; and a drain electrode disposed on a second side of the substrate. The second side is opposite to the first side. A part of the base region contacting the sidewall of the trench provides a channel region so that current flows between the source electrode and the drain electrode via the source region, the channel region and the drift layer when a voltage is applied to the gate electrode. The source region has multi-layered structure including a first layer and a second layer. The first layer as an upper layer contacts the source electrode with ohmic contact. The second layer as a lower layer has an impurity concentration, which is lower than an impurity concentration of the first layer.

In the above device, even when a corner of the trench is rounded, the sidewall of the trench corresponding to the channel region in the base region has a certain face orientation, so that channel mobility is improved.

Alternatively, the first layer may include a first impurity having the first conductive type, and the second layer includes a second impurity having the first conductive type. The second impurity has an atomic radius, which is smaller than an atomic radius of the first impurity. In this case, crystal defects in the second layer is lower than that in the first layer. Thus, the second layer is hardly side-etched, so that the channel mobility is much improved. Further, the source electrode may be disposed on the first layer, and the second layer may be disposed on the base region. Furthermore, the trench may have an open end, which is rounded. The first layer has a rounded corner at the open end of the trench, and the rounded open end of the trench is arranged within the first layer so that the rounded open end does not reach the second layer. Further, the first side of the substrate may have a {0001}-face orientation. The sidewall of the trench is defined by a <11-20>-direction, and a bottom of the trench has the {0001}-face orientation.

Alternatively, the impurity concentration of the second layer is equal to or lower than $1 \times 10^{20}$ cm$^{-3}$. Further, the impurity concentration of the first layer may be equal to or lower than a solid solubility limit. The impurity concentration of the second layer is higher than an impurity concentration of the base region. Furthermore, the impurity concentration of the first layer may be in a range between $1\times10^{20}/\text{cm}^3$ and $1\times10^{22}/\text{cm}^3$.

Alternatively, the source region may have a thickness equal to or larger than 0.1 microns.

Alternatively, the first layer may be separated from the sidewall of the trench, and the first layer is arranged only under the source electrode.

According to a second aspect of the present disclosure, a manufacturing method of a SiC semiconductor device includes: forming a drift layer on a front side of a substrate, wherein the substrate is made of SiC and has a first conductive type or a second conductive type, and the drift layer is made of SiC and has the first conductive type; implanting an impurity having the second conductive type at a predetermined position on a surface of the drift layer, or growing a second conductive type layer at the predetermined position on the surface of the drift layer so that a base region having the second conductive type and made of SiC is formed; implanting an impurity having the first conductive type in a surface portion of the base region so that a source region having the first conductive type and made of SiC is formed; etching the source region, the base region and the drift layer perpendicular to the surface of the drift layer so that a trench penetrating the source region and the base region and reaching the drift layer is formed; rounding a corner of the trench; forming a gate insulation film on an inner wall of the trench after the rounding; forming a gate electrode in the trench via the gate insulation film; forming a source electrode electrically coupled with the source region; and forming a drain electrode on a backside of the substrate. The implanting the impurity having the first conductive type includes: forming a first layer as an upper layer; and forming a second layer as a lower layer. The second layer has an impurity concentration, which is lower than, an impurity concentration of the first layer.

In the above method, even when a corner of the trench is rounded, the sidewall of the trench corresponding to the channel region in the base region has a certain face orientation, so that channel mobility is improved.

Alternatively, the forming the first layer may be performed with using a mask, which is the same as a mask in the forming the second layer.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
a substrate made of SiC and having a first conductive type or a second conductive type;
a drift layer made of SiC, having the first conductive type, and disposed on a first side of the substrate;
a trench perpendicular to a surface of the drift layer and disposed in the drift layer;
a base region having the second conductive type, made of SiC, contacting a sidewall of the trench, and sandwiching the trench;
a source region made of SiC, having the first conductive type, contacting the sidewall of the trench, sandwiching the trench, and arranged in an upper portion of the base region;
a gate insulation film disposed on an inner wall of the trench;
a gate electrode disposed in the trench via the gate insulation film;
a source electrode electrically coupled with the source region and the base region; and
a drain electrode disposed on a second side of the substrate, wherein
the second side is opposite to the first side,
a part of the base region contacting the sidewall of the trench provides a channel region so that current flows between the source electrode and the drain electrode via the source region, the channel region and the drift layer when a voltage is applied to the gate electrode,
the source region has multi-layered structure including a first layer and a second layer,
the first layer as an upper layer contacts the source electrode with ohmic contact,
the second layer as a lower layer has an impurity concentration, which is lower than an impurity concentration of the layer,
the first layer includes a first impurity having the first conductive type, and the second layer includes a second impurity having the first conductive type, and
the second impurity has an atomic radius that is smaller than an atomic radius of the first impurity.

2. The SiC semiconductor device according to claim 1, wherein the source electrode is disposed on the first layer, and
wherein the second layer is disposed on the base region.

3. The SiC semiconductor device according to claim 2, wherein the trench has an open end, which is rounded,
wherein the first layer has a rounded corner at the open end of the trench, and
wherein the rounded open end of the trench is arranged within the first layer so that the rounded open end does not reach the second layer.

4. The SiC semiconductor device according to claim 3, wherein the first side of the substrate has a {0001}-face orientation,
wherein the sidewall of the trench is defined by a <11-20>-direction, and
wherein a bottom of the trench has the {0001}-face orientation.

5. The SiC semiconductor device according to claim 1, wherein the impurity concentration of the second layer is equal to or lower than $1\times10^{20}$ cm$^{-3}$.

6. The SiC semiconductor device according to claim 5, wherein the impurity concentration of the first layer is equal to or lower than a solid solubility limit, and
wherein the impurity concentration of the second layer is higher than an impurity concentration of the base region.

7. The SiC semiconductor device according to claim 6, wherein the impurity concentration of the first layer is in a range between $1\times10^{20}/\text{cm}^3$; and $1\times10^{22}/\text{cm}^3$.

8. The SiC semiconductor device according to claim 1, wherein the source region has a thickness equal to or larger than 0.1 microns.

9. The SiC semiconductor device according to claim 1, wherein the first layer is separated from the sidewall of the trench, and
wherein the first layer is arranged only under the source electrode.

* * * * *